United States Patent [19]
Yamamoto et al.

[11] Patent Number: 5,714,781
[45] Date of Patent: Feb. 3, 1998

[54] SEMICONDUCTOR DEVICE HAVING A GATE ELECTRODE IN A GROVE AND A DIFFUSED REGION UNDER THE GROVE

[75] Inventors: Tsuyoshi Yamamoto, Kariya; Masami Naito, Inazawa; Takeshi Fukazawa, Nagoya, all of Japan

[73] Assignee: Nippondenso Co., Ltd., Kariya, Japan

[21] Appl. No.: 638,388

[22] Filed: Apr. 26, 1996

[30] Foreign Application Priority Data

Apr. 27, 1995 [JP] Japan .................................. 7-104159

[51] Int. Cl.$^6$ .......................... H01L 29/76; H01L 29/94
[52] U.S. Cl. .................. 257/329; 257/330; 257/333; 257/341; 257/389; 257/397; 257/263
[58] Field of Search ........................ 257/329, 330, 257/333, 389, 397, 341, 263

[56] References Cited

U.S. PATENT DOCUMENTS

| | | | |
|---|---|---|---|
| 4,503,449 | 3/1985 | David et al. | 257/330 |
| 4,731,343 | 3/1988 | Beinvogl . | |
| 4,824,795 | 4/1989 | Blanchard . | |
| 4,929,987 | 5/1990 | Einthoven | 257/330 |
| 4,992,390 | 2/1991 | Chang . | |
| 5,460,985 | 10/1995 | Tokura et al. . | |
| 5,470,770 | 11/1995 | Takahashi et al. . | |
| 5,473,176 | 12/1995 | Kakumoto | 257/330 |

FOREIGN PATENT DOCUMENTS

| | | |
|---|---|---|
| 61-199666 | 9/1986 | Japan . |
| 62-012167 | 1/1987 | Japan . |
| 63-266882 | 11/1988 | Japan . |
| 4-058532 | 2/1992 | Japan . |

OTHER PUBLICATIONS

Silicon Processing, vol. 1, S. Wolf & R.N. Tauber 1986.

Tokura, et al: "The DMOS Consisting of Channel Region Defined by LOCOS (LOCOS-DMOS): A New Process/Device Technology for Low On-Resistance Power MOSFET" 5th Intn'l Symposium On Power Semiconductor Device And ICs, May 18-20, 1993, pp. 135-140.

Tokura, et al: "Concave-DMOSFET: A New Super Low On-Resistance Power MOSFET", The 1994 Intn'l Conference On Solid State Devices And Materials, Aug. 23-35, 1994, Ch.B-1-2, pp.763-765.

Sakai, et al: "Methods to Improve the Surface Planarity of Locally Oxidized Silicon Devices", J. Electrochem. Soc.: Solid-State Science And Technology, vol. 124, No. 2, Feb. 1977, pp. 318-320.

Tokura, et al: "Concave-DMOSFET: A New Super-Low on Resistance Power MOSFET", Japanese Journal of Applied Physics, vol. 34, No. 2B, Feb. 1995, pp. 903-908.

*Primary Examiner*—Tom Thomas
*Assistant Examiner*—Fetsum Abraham
*Attorney, Agent, or Firm*—Cushman, Darby & Cushman IP Group of Pillsbury, Madison & Sutro LLP

[57] ABSTRACT

A power MOSFET having a groove for forming a channel improved for shortening the switching time and increasing the dielectric breakdown strength of the gate oxide film is disclosed. The power MOSFET includes a concave structure in which a gate oxide film at a groove bottom is thickened. Namely, since the gate oxide film between a gate electrode and a first conductivity type semiconductor layer is thick, the capacitance of the oxide film therebetween is reduced. Therefore, the input and output capacitance of the gate oxide film can be reduced, and switching loss can be also reduced since the switching time can be shortened. Further, greater dielectric breakdown strength of the gate oxide film can be obtained as a result of the thickened gate oxide film at the groove bottom.

25 Claims, 17 Drawing Sheets

SEMICONDUCTOR DEVICE HAVING A GATE ELECTRODE IN A GROVE AND A DIFFUSED REGION UNDER THE GROVE

CROSS REFERENCE TO RELATED APPLICATION

This application is based upon and claims the benefit of priority of the prior Japanese Patent Application No. 7-104159 filed on Apr. 27, 1995, incorporated herein by reference.

BACKGROUND OF THE INVENTION

1. Field of the Invention

The present invention relates to a semiconductor device as a power semiconductor element, i.e., a vertical MOSFET (Metal Oxide Semiconductor Field Effect Transistor) and IGBT (Insulated Gate Bipolar Transistor), used for MOS-IC or the like in which the power semiconductor element is incorporated.

2. Related Arts

As for a conventional semiconductor device, a power MOSFET disclosed in International Publication PCT WO 93/03502 or Japanese Unexamined Patent Publication No. Sho 62-12167 has been known.

The power MOSFET, characterized in having a concave gate structure with a concavity for forming a channel and a gate electrode disposed therein through a gate oxide film, has received much attention for its reducing the ON-resistance greatly compared to planar type and trench type structures.

However, when actually manufacturing devices according to the conventional manufacturing method, it has been verified by the inventors that the film thickness of a gate oxide film formed on a concave portion is uneven. In particular, in case the oxide film at the bottom of the concavity is thinner than the oxide film at the sidewall of the concavity, this unevenness of the film thickness results in some problems. The capacitance of oxide film between the gate electrode and the semiconductor substrate (drain) increases, the input, output and feedback capacitance of the gate oxide film also increase, and thereby a switching time becomes longer. Further, as the film thickness of the oxide film at the bottom of the concavity is thin, poor dielectric breakdown strength is obtained at this part of the gate oxide film.

SUMMARY OF THE INVENTION

In view of the above problems, it is a primary object of the present invention to obtain a concave type power MOSFET having a shorter switching time and greater dielectric breakdown strength.

The inventors of the present invention found that the above problems have been caused due to the oxide film formed thinner at the bottom rather than at the sidewall of the concavity. Therefore, according to the present invention, a gate insulating film positioned at the bottom of the concavity is selectively thickened so that the shorter switching time and greater dielectric breakdown strength of the gate insulating film can be obtained.

To accomplish the above-mentioned object, a semiconductor device according to the present invention has a DMOS structure formed on a semiconductor layer of a first conductivity type, a channel region of which is defined at a sidewall surface of a concavity located at a surface of the semiconductor layer, and is characterized by a gate insulating film which is disposed to cover at least an inner surface of the concavity and which has a thickness controlled to be thicker at a bottom surface rather than at the sidewall surface of the concavity.

Herein, the DMOS structure of the semiconductor devise of the present invention is preferably structured by: a body region of a second conductivity type disposed at the surface of the semiconductor layer to include the sidewall surface of the concavity; a source region of the first conductivity type disposed within the body region to be in proximity of an inlet portion of the concavity; and a gate electrode disposed along the inner surface of the concavity with the gate insulating film interposed.

According to the above-mentioned structure, since the gate insulating film at the bottom surface of the concavity is thickened, i.e., the film thickness of the gate insulating film between the gate electrode and the first conductivity type semiconductor region under the bottom surface of the concavity is thickened, the capacitance of the gate insulating film is reduced at the thickened portion. Accordingly, the input and output capacitance of the gate insulating film can be reduced, and a switching loss can be also reduced because switching time can be shortened. Furthermore, as the film thickness of the gate insulating film at the bottom surface of the concavity is thickened, greater dielectric breakdown strength is obtained.

The DMOS structure can be manufactured by, like in the above-mentioned PCT WO93/03502, a combination of local oxidation of silicon (LOCOS) technique, diffusion self-alignment using the formed thick oxide film (hereinafter referred to as a LOCOS oxide film) as a double diffusion mask and chemically etching off the LOCOS oxide film, or by employing a conventional trench etching technique. However, it is necessary for the manufacturing process of the semiconductor device to be designed to cause the gate insulating film to be selectively thickened at the bottom surface of the concavity.

In order to thicken the gate insulating film at the bottom surface of the concavity, various methods can be employed. For example, it may be applicable to selectively make the bottom surface of the concavity amorphous by ion-implantation prior to the oxidation step for forming the gate insulating film. Further, it may be possible to employ a preformation of an insulating film making up a part of the gate insulating film utilizing, for example, a deposition of an insulating film or a local oxidation to thicken the gate insulating film at the bottom surface of the concavity.

Furthermore, it is preferable that the gate insulating film formed on the bottom surface of the concavity should become thicker as closer to the central portion of the concavity. The reason is as follows.

To define a channel region in the body region firmly, the gate electrode should be formed as deeply as possible in the concavity. However, when the whole gate insulating film at the bottom surface of the concavity is thickened, to form the gate electrode deeply, it is necessary to deepen the concavity further to the junction depth of the body region. On the other hand, when the gate insulating film at the bottom surface of the concavity has such distribution in film thickness described above, the gate electrode can be provided deeply for the sidewall surface of the concavity without deepening the concavity, thereby firmly defining the channel region in the body region.

Other objects and features of the invention will appear in the course of the description thereof, which follows.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF THE PRESENTLY PREFERRED EXEMPLARY EMBODIMENTS

The preferred embodiments of the present invention are described with reference to the accompanying drawings.

A semiconductor device according to a basic structure of the present invention is described with reference to FIGS. 1 though 19, and a semiconductor device according to embodiments of the present invention will be described with reference to figures thereafter. In the basic structure of the present invention, the film thickness of the gate insulating film, e.g., gate oxide film, is illustrated even for convenience. In the embodiments of the present invention, the film thickness of the gate oxide film, which are the main features of the present invention, are described and indicated in the accompanying drawings.

Figure 1A:
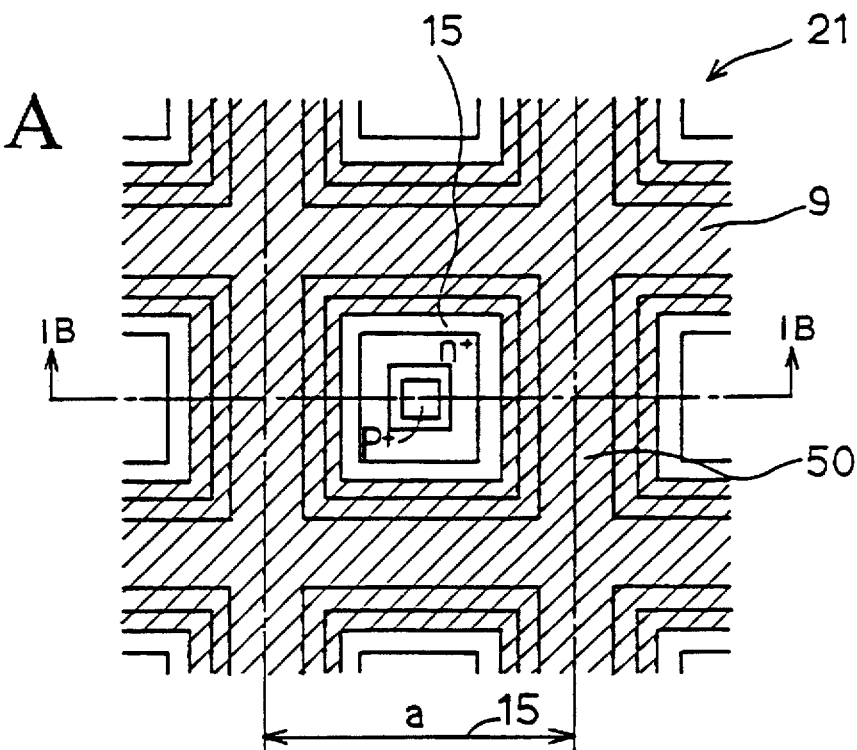
FIG. 1A is a plan view illustrating a part of a vertical type power MOSFET of a basic structure according to the present invention.
Figure 1B:
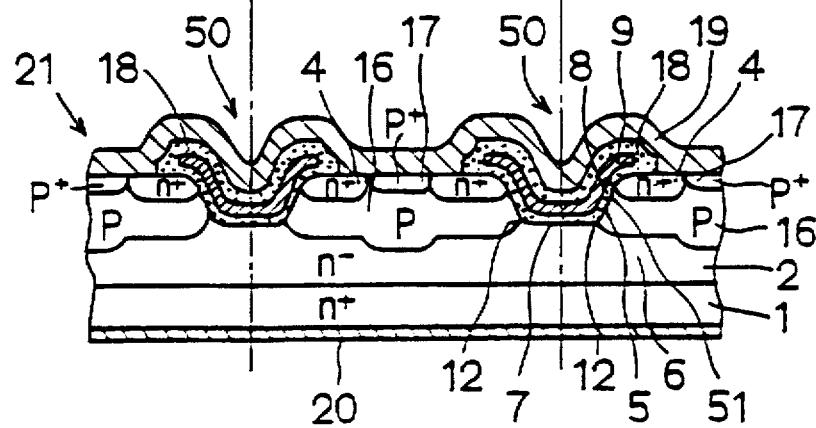
FIG. 1B is a cross-sectional view taken along line IB—IB of FIG. 1A.
Figure 4:
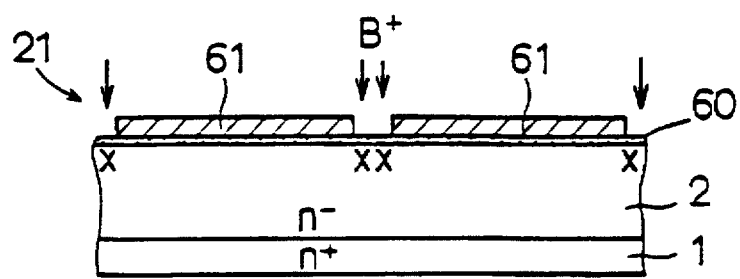
FIG. 4 is a cross-sectional view illustrating the manufacturing process of the important part of the vertical type power MOSFET of the basic structure.
Figure 5:
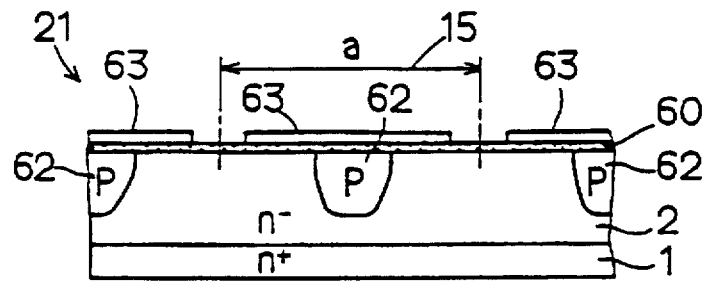
FIG. 5 is a cross-sectional view illustrating the manufacturing process of the important part of the vertical type power MOSFET of the basic structure.
Figure 6:
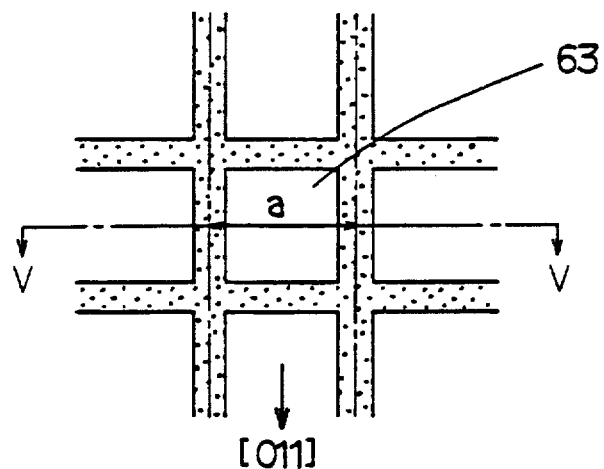
FIG. 6 is a plan view illustrating the manufacturing process of the important part of the vertical type power MOSFET of the basic structure.
Figure 7:
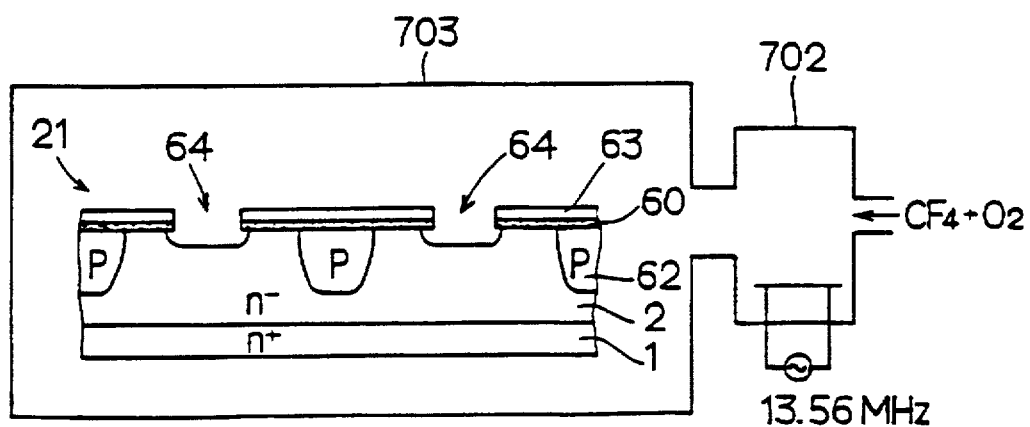
FIG. 7 is a view illustrating the manufacturing process of the vertical type power MOSFET of the basic structure.
Figure 8:
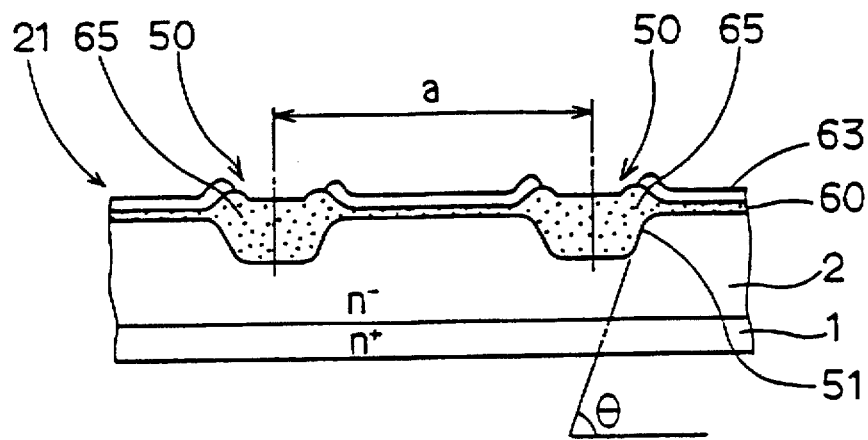
FIG. 8 is a cross-sectional view illustrating the manufacturing process of the important part of the vertical type power MOSFET of the basic structure.
Figure 9:
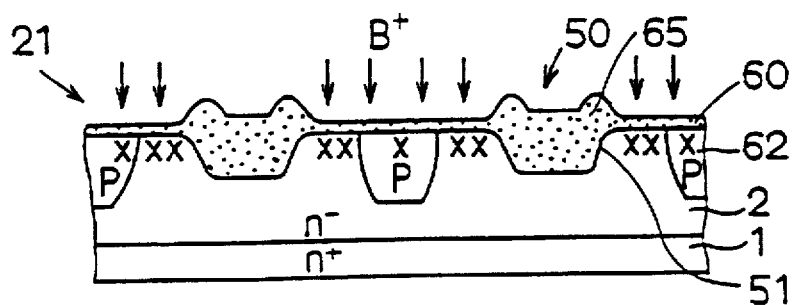
FIG. 9 is a cross-sectional view illustrating the manufacturing process of the important part of the vertical type power MOSFET of the basic structure.
Figure 10:
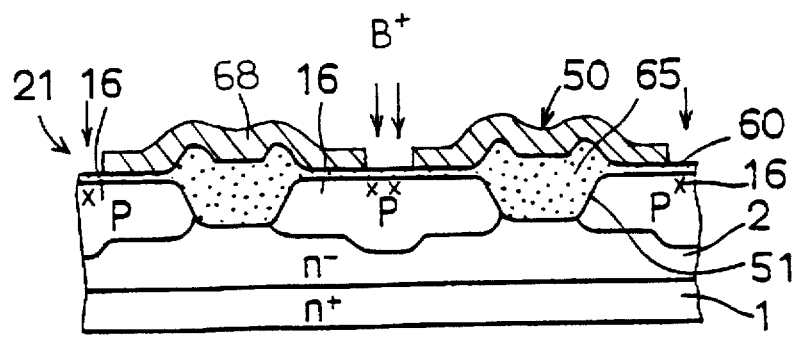
FIG. 10 is a cross-sectional view illustrating the manufacturing process of the important part of the vertical type power MOSFET of the basic structure.
Figure 11:
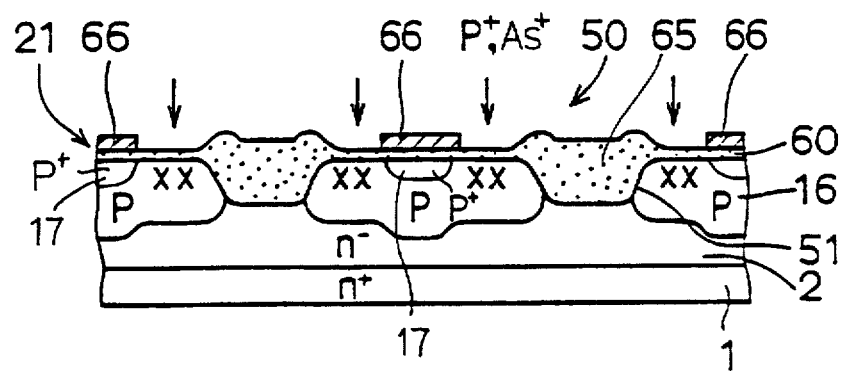
FIG. 11 is a cross-sectional view illustrating the manufacturing process of the important part of the vertical type power MOSFET of the basic structure.
Figure 12:
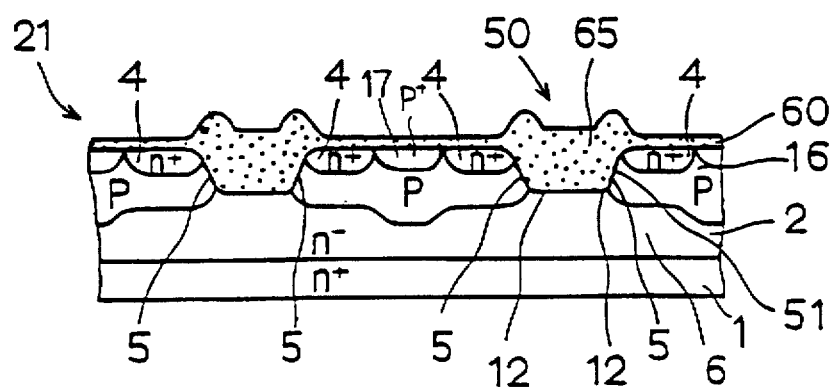
FIG. 12 is a cross-sectional view illustrating the manufacturing process of the important part of the vertical type power MOSFET of the basic structure.

FIG. 1A is a plan view of a vertical type power MOSFET composed of numerous square unit cells, and FIG. 1B is a cross-sectional view taken along line IB—IB of FIG. 1A. FIGS. 2 through 19 are descriptive views of the respective stages of the manufacturing method for the vertical type power MOSFET, wherein FIG. 4 is a cross-sectional view of a wafer into which boron ions have been implanted to form a central part of a p-type body region (well region); FIG. 5 is a cross-sectional view of the wafer whose silicon nitride film deposited thereon has been patterned at a pitch which is equal to the dimension of a unit cell "a" for LOCOS (local oxidation of silicon); FIG. 8 is a cross-sectional view of the wafer on which a thick oxide film by LOCOS (hereinafter referred to as a LOCOS oxide film) has been formed; FIG. 9 is a cross-sectional view of the wafer into which boron ions have been implanted to form a p-type body region (channel-well region) by using the LOCOS oxide film as a mask; FIG. 10 is a cross-sectional view of the wafer in which the p-type body region has been formed by means of thermal diffusion and further into which boron ions have been implanted to form a p$^+$-type body contact region; FIG. 11 is a cross-sectional view of the wafer into which arsenic ions have been implanted to form an n$^+$-type source region by using the LOCOS oxide film as a mask; FIG. 12 is a cross-sectional view of the wafer in which the n$^+$-type source region has been formed by means of thermal diffusion; FIG. 18 is a cross-sectional view of the wafer on which a gate oxide film has been grown by means of thermal oxidation after the removal of the LOCOS oxide film; FIG. 19 is a cross-sectional view of the wafer with a gate electrode formed on the gate oxide film; and FIG. 1B is the cross-sectional view of the completed wafer on which an interlayer insulating film, a source electrode and a drain electrode have been formed.

Figure 30:
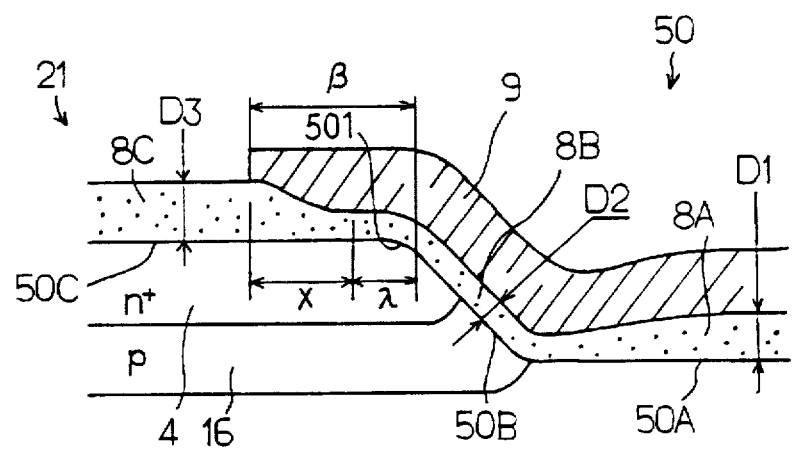
FIG. 30 is an enlarged cross-sectional view illustrating the important part of the embodied vertical type power MOSFET.

FIGS. 1 through 19 illustrate gate oxide film 8 whose film thickness is even for convenience's sake, but as shown in FIG. 30, actual gate oxide film 8 has different thickness in areas: a gate oxide film 8A formed on a bottom surface of concavity 50; a gate oxide film 8B formed on a sidewall of concavity 50; and a gate oxide film 8C formed on a wafer surface in the proximity of the inlet part of concavity 50 (hereinafter referred to as a bottom positioned gate oxide film 8A, a sidewall positioned gate oxide film 8B and a surface positioned gate oxide film 8C, respectively). As shown in FIG. 30, a film thickness D1 of bottom positioned gate oxide film 8A is thicker than a film thickness D2 of sidewall positioned gate oxide film 8B, and a film thickness D3 of surface positioned gate oxide film 8C is thicker than film thickness D2 of sidewall positioned gate oxide film 8B.

The main part (unit cell part) of the vertical type power MOSFET according to this embodiment is so constructed as illustrated in FIGS. 1A and 1B in which numerous unit cells 15 are laid out lengthwise and breadthwise at a pitch (unit cell dimension) of a.

A basic structure of the vertical power MOSFET according to the present invention will now be described with reference to FIGS. 1A, 1B and 21.

A wafer 21 is composed of a semiconductor substrate 1 comprising n$^+$-type silicon and an n$^-$-type epitaxial layer 2 formed on semiconductor substrate 1, and numerous unit cells 15 are regularly laid out on the main surface of wafer 21. To form a U-groove (i.e., concave structure) 50 at a pitch of the unit cell dimension a (=approximately 12 µm), on the main surface of wafer 21 is temporary formed a LOCOS oxide film to a thickness of approximately 1 µm, and then, by performing a double diffusion of boron (B) and arsenic (As) using the LOCOS oxide film as a double diffusion mask, a p-type body region 16 to a junction depth of approximately 1 µm and an n$^+$-type source region 4 to a junction depth of approximately 0.5 µm are disposed self-aligningly with concavity 50 created by an erosion due to the formation of the LOCOS oxide film.

A p$^+$-type body contact region 17 is formed to a junction depth of approximately 0.5 µm in the central part surface of the p-type body region 16, whereby a channel 5 of approximately 0.5 µm in channel length is defined on the sidewall part 51 of U-groove 50. Incidentally, the p-type body region 16 is set to a junction depth which does not occur a destruction due to breakdown at an edge part 12 on the bottom of the U-groove 50. Furthermore, boron ions have been implanted into the central part of the p-type body region 16 beforehand to deepen the junction depth in the central part of the p-type body region 16 down from the circumference, so that a breakdown can be caused when a high voltage is applied between the drain electrode and the source electrode. Namely, the bottom wall of U-groove 50 is set to be positioned at a depth shallower than p-type body region 16.

After the double diffusion, the LOCOS oxide film, which is used for forming U-groove 50 as well as for the diffusion mask, is removed, a gate oxide film 8 are formed to a thickness of approximately 50 nm on the inner wall of U-groove 50 and on gate oxide film 8 are formed a gate electrode 9 with polysilicon to a thickness of approximately 400 nm and an interlayer insulating film 18 with borophosphosilicate glass (BPSG) to a thickness of approximately 1 µm. Furthermore, ohmic contact is made between a source electrode 19 formed on interlayer insulating film 18 and n$^+$-type source region 4 and p$^+$-type body contact region 17 through a contact hole. On the other hand, a drain electrode 20 is formed commonly on the back surface of semiconductor substrate 1 to make ohmic contact therewith.

An example of the basic manufacturing method employed for this basic structure of the embodiment will now be described. A method of controlling the film thickness of the gate oxide film will be described later.

Figure 2:
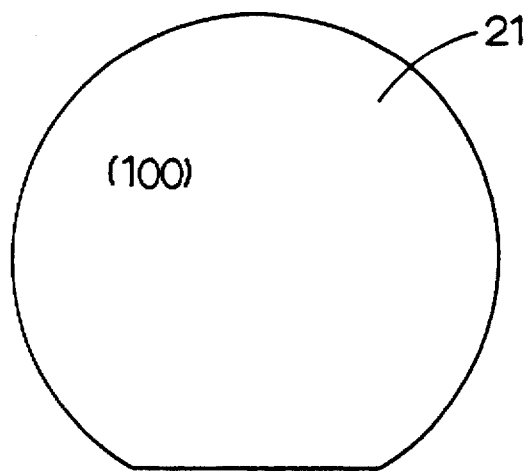
FIG. 2 is a plan view illustrating a manufacturing process of the vertical type power MOSFET of the basic structure according to the present invention.
Figure 3:
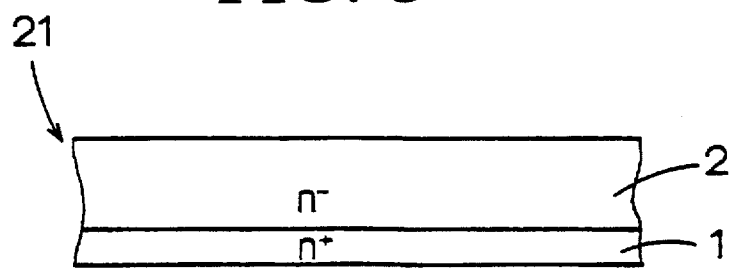
FIG. 3 is a cross-sectional view illustrating the manufacturing process of an important part of the vertical type power MOSFET of the basic structure.

A wafer 21 is prepared in which, as illustrated in FIGS. 2 and 3, an n$^-$-type epitaxial layer 2 is formed by means of homo-epitaxial growth on the main surface of the (100)-oriented n$^+$-type silicon substrate 1 (semiconductor substrate corresponding to this n$^-$/n$^+$ structure). The impurity concentration of n$^+$-type silicon substrate 1 is approximately 1 through $3 \times 10^{19}$ cm$^{-3}$ and the thickness thereof is 400 µm, and the thickness of epitaxial layer 2 is approximately 7 µm and the impurity concentration thereof is approximately $10^{16}$ cm$^{-3}$.

As shown in FIG. 4, a field oxide film 60 is formed to a thickness of approximately 50 nm by thermally oxidizing the main surface of wafer 21 and subsequently a photoresist film 61 is deposited and patterned to form a pattern opened in the central part of a region where a cell is to be formed by means of well-known photolithographic techniques. Then, boron ions (B$^+$) are implanted into epitaxial layer 2 by using photoresist film 61 as a mask.

As illustrated in FIG. 5, after removing photoresist film 61, a p-type diffusion region 62 is formed to a junction depth of approximately 1 µm by means of thermal diffusion. This p-type diffusion region 62 ultimately constitutes a part of p-type body region 16 (described later) and plays a role of improving the surge resistance of the device by stably causing a breakdown at the bottom part of p-type diffusion area 62 when a high voltage is applied to between the drain electrode and the source electrode.

Furthermore, as illustrated in FIG. 5, a silicon nitride film 63 is deposited to a thickness of approximately 200 nm on the main surface of wafer 21. Then as illustrated in the plan view of FIG. 6 (FIG. 5 shows a cross-section along line V—V in FIG. 6), silicon nitride film 63 is patterned to be vertical and parallel to an orientation of <011> to form a lattice-like open pattern opening at a pitch of a (dimension of unit cell 15). During the formation of this open pattern, mask-alignment is conducted so that the above p-type diffusion region 62 can be positioned in the central part of the pitch.

Field oxide film 60 is then etched using silicon nitride film 63 as a mask. Following this, as illustrated in FIG. 7, a chemical dry etching (CDE) is performed on resultant wafer 21. That is to say, a chemically active species is made by generating plasma within a discharge chamber 702 into which carbon tetrafluaride and oxygen gases are supplied, the active species are transported into a reaction chamber 703, and an initial groove 64 is isotropically formed by chemically dry-etching n⁻-type epitaxial layer 2 within reaction chamber 703.

Next, as illustrated in FIG. 8, the part of groove 64 is thermally oxidized using silicon nitride film 63 as an oxidation mask. This is an oxidation method well known as LOCOS (local oxidation of silicon) method. By this oxidation, a LOCOS oxide film 65 is formed on the surface of wafer 21 so as to have the lattice-like surface pattern shape, and concurrently the shape of a U-groove 50 (concave structure), i.e., bathtub-shaped groove structure, is defined by erosion of the surface of n⁻-type epitaxial layer 2 due to the growth of LOCOS oxide film 65.

In the above process, the conditions of chemical dry etching and LOCOS oxidation are selected by controlling an elevation angle θ of the sidewall of the U-groove 50 (FIG. 8) so that the index of plane of the channel forming part on the sidewall surface of U-groove 50 can be approximately (111).

Inside wall surface 51 of U-groove 50 formed by the LOCOS oxidation as described above has a high flatness and a few defects, and the surface condition thereof is as good as the main surface of wafer 21 in the initial stage illustrated in FIG. 2.

Then, as illustrated in FIG. 9, boron ions are implanted through thin field oxide film 60 using LOCOS oxide film 65 as a diffusion mask. At this time, the boundary part between LOCOS oxide film 65 and field oxide film 60 constitutes a self-alignment position to exactly define a region into which boron ions are implanted.

Then, as illustrated in FIG. 10, thermal diffusion is applied to diffuse the implanted boron ions into epitaxial layer 2 to a junction depth of approximately 1 μm. As the result of this thermal diffusion, p-type diffusion region 62 previously formed in the process illustrated in FIG. 5 and the boron diffusion region into which boron ions have been implanted in the process illustrated in FIG. 9 are integrated into p-type body region 16 (equivalent to a body region), both ends of which are self-aligned and defined by the positions of the sidewalls of U-groove 50. Next, a photoresist film 68 is deposited and patterned to form a pattern opened in the central part of p-type body region 16 as illustrated in FIG. 10. Then, boron ions are implanted through oxide film 60 by using photoresist film 68 as a mask and thermally diffused to form a p⁺-type body contact region 17. Since the temperature of thermal diffusion is relatively high at this time, the thermal diffusion is carried out before a later-described phosphorus (or arsenic) ions are implanted.

Subsequently, as illustrated in FIG. 11, after forming a photoresist film 66 which is patterned so as to cover the central part of the surface of p-type body region 16 surrounded by LOCOS oxide film 65, phosphorous (or arsenic) ions are implanted through thin field oxide film 60 using photoresist film 66 and LOCOS oxide film 65 as a diffusion mask. In this process, like the process illustrated in FIG. 9 in which boron ions have been implanted, the boundary part between LOCOS oxide film 65 and field oxide film 60 constitutes a self-alignment position, whereby the ion implantation region can exactly be defined.

The next process is, as illustrated in FIG. 12, to apply thermal diffusion to form an n⁺-type source region 4 of approximately 0.5 μm in junction depth and define a channel 5 (equivalent to a channel region) as well. The end surface being in contact with U-groove 50 in the region of n⁺-type source region 4 is self-aligned and defined in the position of the sidewall of U-groove 50.

The process illustrated in FIGS. 9 to 12 fix the junction depth and shape of p-type body region 16. Here, a point is that the shape of p-type body region 16 is perfectly symmetric with respect to U-groove 50 due to the self-alignment and thermal diffusion. In addition, since the upper surface of the semiconductor substrate is in an amorphous state due to the ion implantation for forming source region 4, body region 16 and body contact region 17, the surface positioned oxide film can be easily thickened (compared to the oxide film at the sidewall of groove 50) when forming the later-described gate oxide film.

Figure 13:
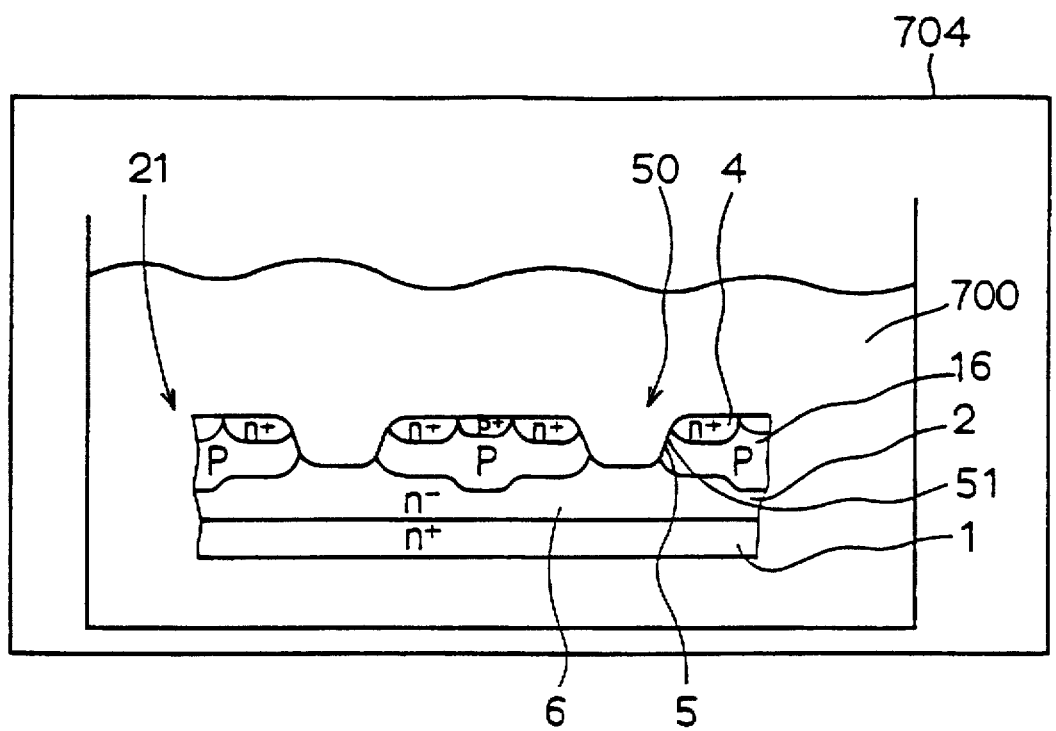
FIG. 13 is a view illustrating the manufacturing process of the vertical type power MOSFET of the basic structure.

Next, as illustrated in FIG. 13, an inside wall 51 of U-groove 50 is exposed by removing LOCOS oxide film 65 while terminating the exposed silicon surface with hydrogen within an aqueous solution 700 containing hydrofluoric acid. This process may be performed by applying a shading cloth 704 over the wafer 21 to shade from light the surface on which LOCOS oxide film 65 is formed.

After the completion of the above process, wafer 21 is taken out of the aqueous solution and dried in a clean air.

Figure 15:
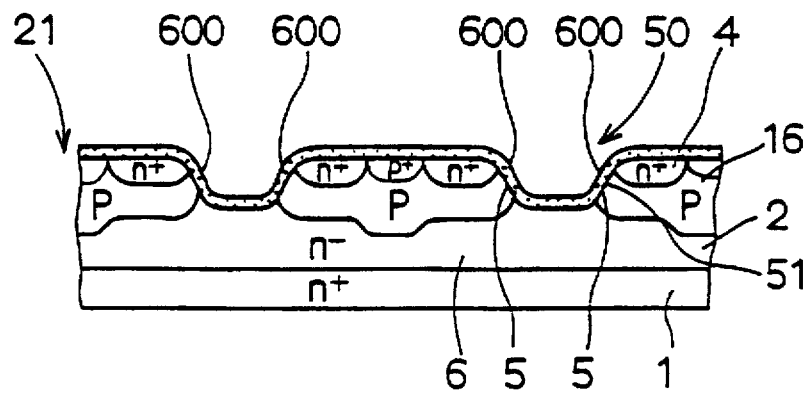
FIG. 15 is a cross-sectional view illustrating the manufacturing process of the important part of the vertical type power MOSFET of the basic structure.

Then, as illustrated in FIG. 15, an oxide film 600 is formed on a sidewall surface 5 of U-groove 50 (i.e., the surface of p-type body region 16 where channel 5 is to be formed) until the (111) plane appears at the interface between the sidewall surface and the formed oxide film 600. By this thermal oxidation process, the flatness of the surface where channel 5 is to be formed is improved in terms of atomic order.

Figure 14:
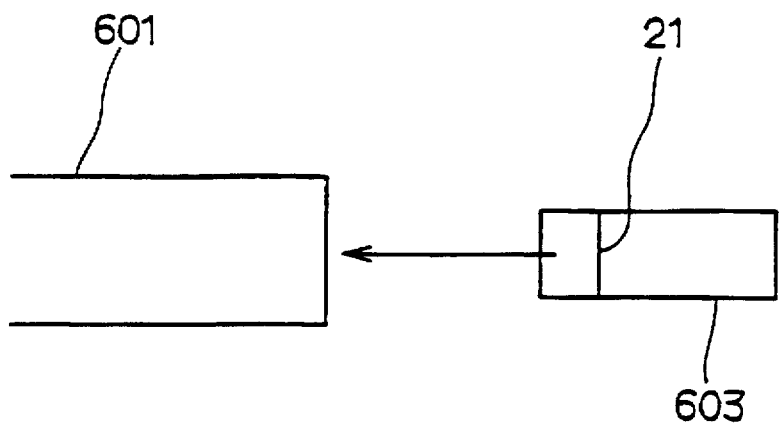
FIG. 14 is a view illustrating the manufacturing process of the vertical type power MOSFET of the basic structure.

As illustrated in FIG. 14, this thermal oxidation process is performed by slowly inserting a quartz wafer boat 603 holding wafer 21 into an oxidation furnace 601 which is maintained within the oxygen atmosphere at a temperature of approximately 1,000° C. In this thermal oxidation process, as the initial stage of the oxidation is performed at a comparatively lower temperature, the scattering of impurities within p-type body region 16 and n⁺-type source region 4 to the outside of wafer 21 during the thermal oxidation process can be suppressed.

Figure 16:
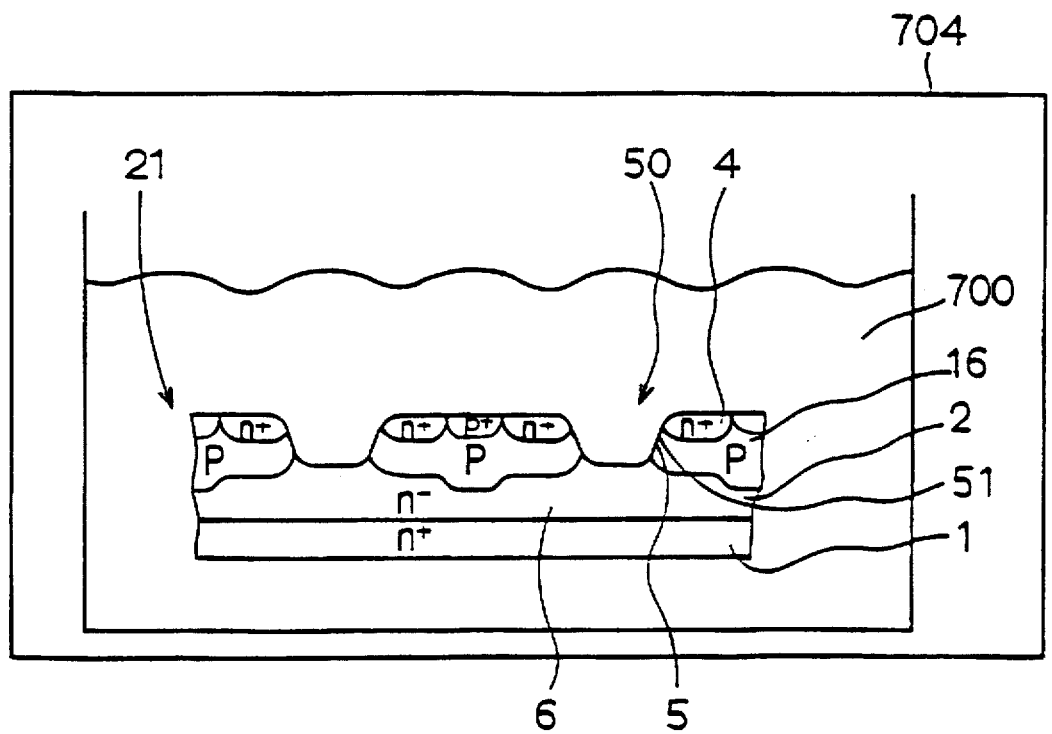
FIG. 16 is a view illustrating the manufacturing process of the vertical type power MOSFET of the basic structure.

Then, the thus formed oxide film 600 is removed while applying shading cloth 704 as illustrated in FIG. 16. As well as the removal of local oxide film described above, the removal of oxide film 600 is also performed while terminating the exposed silicon surface with hydrogen within an aqueous solution containing hydrofluoric acid. Inside wall surface 51 of U-groove 50 formed by this method is a good silicon surface with a high flatness and a few defects.

As illustrated in FIG. 18, a gate oxide film 8 is then formed to a thickness of approximately 50 nm on the sidewall surface and bottom wall surface of U-groove 50 by thermal oxidation.

This thermal oxidation process is, as described above and as illustrated in FIG. 17, performed by slowly transferring quartz wafer boat 603 holding wafer 21 into an oxidation furnace 601 which is maintained within the oxygen atmosphere 602 at a temperature of approximately 1,000° C. In this thermal oxidation process, as the initial stage of the oxidation is performed at a comparatively low temperature, the scattering of impurities within p-type body region 16 and n⁺-type source region 4 to the outside of wafer 21 during the thermal oxidation process can be suppressed. The film quality and thickness uniformity of gate oxide film 8 (8B), the interface state density of the interface where channel 5 is formed and the carrier mobility are as high as those of the conventional planar type DMOSFET.

Then, as illustrated in FIG. 19, gate electrode 9 is formed by depositing a polysilicon film on the main surface of wafer 21 to a thickness of approximately 400 nm and patterning the deposited polysilicon film so as to be separated by a distance which is shorter by $2^\beta$ than a distance between the inlet corners of two U-grooves 50 adjacent to each other. Then, gate oxide film 8 is further oxidized (a thick film part is formed) so as to be thicker at the end part of gate electrode 9. Here, when the length of a part where gate oxide film 8 is thickened is x as illustrated in FIG. 30, the above mentioned $\beta$ is set to be longer than x ($\beta$>x).

The processes illustrated in FIGS. 9 through 19 are important stages of the manufacturing process according to the embodied basic structure, in which p-type body region 16, $n^+$-type source region 4 and channel 5 are formed by using LOCOS oxide film 65 as a double diffusion mask for self-alignment, then LOCOS oxide film 65 is removed and gate oxide film 8 and gate electrode 9 are formed. In particular, the processes illustrated in FIGS. 14 through 18 for forming gate oxide film 8 will be detailed in the various concrete embodiments described later.

Next, as illustrated in FIG. 1B, interlayer insulating film 18 is formed with BPSG on the main surface of wafer 21 and contact holes are made in parts of interlayer insulating film 18 to expose $p^+$-type body contact region 17 and $n^+$-type source region 4 through the contact hole. Furthermore, source electrode 19 is formed with an aluminum film so that ohmic contact is made with $n^+$-type source region 4 and $p^+$-type body contact region 17 through the contact hole. Subsequently, a passivation film (not illustrated) is formed with silicon nitride, etc., for protecting the aluminum film by a plasma enhanced CVD (chemical vapor deposition) technique or the like. On the back surface of wafer 21 is formed drain electrode 20 with three layers of a Ti film, a Ni film and a Au film, an ohmic contact is made between drain electrode 20 and $n^+$-type semiconductor substrate 1.

The thus formed concave type power MOSFET is characterized in that, as illustrated in FIG. 30, gate oxide film 8 is arranged to have areas different in thickness; i.e., bottom positioned gate oxide film 8A formed on the bottom surface of U-groove 50 (detailed later), sidewall positioned gate oxide film 8B formed on the sidewall of U-groove 50, and surface positioned gate oxide film 8C formed on a wafer surface in the proximity of the inlet corner of U-groove 50. Further, surface positioned gate oxide film 8C is arranged to be a part $\lambda$ which is uniform in thickness and smoothly connected to thin sidewall positioned gate oxide film 8B in the neighborhood of the inlet corner of U-groove 50 where source region 4 is extendedly disposed. In other words, surface positioned gate oxide film 8C is composed of the thin film part $\lambda$ and the thick film part x thickly formed in comparison with thin film part $\lambda$, and gate electrode 9 is formed on gate oxide film 8 (from the thick bottom positioned part 8A to the top of the thick film part x in surface positioned part 8C) along U-groove 50.

On a surface part 501 of source region 4, the impurity concentration of source region 4 is lower than the impurity concentration of the flat part surface thereof. Therefore, when a voltage is applied to between gate electrode 9 and source region 4, as the electric field is not mitigated, electrons are accumulated on the surface thereof, the surface electron density increases and the resistance of source region 4 decreases, whereby the ON-resistance can be reduced.

Furthermore, as the gate electrode end part is positioned on thick film part x of surface positioned gate oxide film 8C, the electric field thereat is mitigated and the lifetime of the gate oxide film 8 can be extended.

Furthermore, as shown in FIG. 30, a film thickness D1 of bottom positioned gate oxide film 8A is thicker than a film thickness D2 of sidewall positioned gate oxide film 8B, and a film thickness D3 of surface positioned gate oxide film 8C is thicker than film thickness D2 of sidewall positioned gate oxide film 8B. Therefore, the thickness of gate oxide film 8 is the thinnest at sidewall positioned part 8B where channel 5 is positioned, and thus, the dielectric breakdown strength of gate oxide film 8 is determined by the thickness of sidewall positioned part 8B. This makes it possible for gate oxide film 8 to be thinned down to obtain a low threshold voltage of, for example, 2.5V or lower, while maintaining high gate-to-drain withstand voltage.

Also, since bottom positioned gate oxide film 8A is thickened, i.e., the film thickness of the gate oxide film 8 between gate electrode 9 and $n^-$-type semiconductor region (accumulation region) under the bottom surface of U-groove 50 is thickened, the capacitance of gate oxide film 8 is reduced at the thickened portion. Accordingly, the input and output capacitance of gate oxide film 8 can be reduced, and a switching loss can be also reduced because switching time can be shortened. Furthermore, as the film thickness of gate oxide film 8 at the bottom surface of U-groove 50 is thickened, greater dielectric breakdown strength is obtained.

Next, examples of the method for controlling the film thickness of gate oxide film 8 according to first to sixth embodiments will now be described.

The manufacturing processes of these embodiments represent the above-mentioned basic processes illustrated in FIGS. 14 through 18 in detail.

A manufacturing process of the first embodiment will be described. A part of the basic manufacturing method (FIGS. 1 through 13) is adapted for this manufacturing process.

Figure 20A:
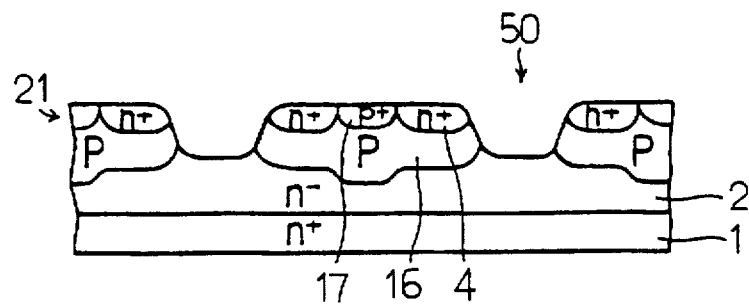
FIGS. 20A through 20D are cross-sectional views illustrating a manufacturing process of an important part of a vertical type power MOSFET according to a first embodiment of the present invention.
Figure 20B:
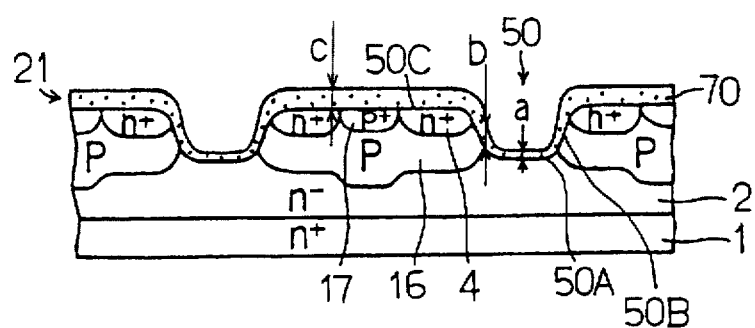

After removing thin field oxide film 60 and LOCOS oxide film 65 formed on the surface of wafer 21 as illustrated in FIG. 20A (like in FIG. 13), a temporary oxide film 70 (corresponding to oxide film 600 of FIG. 15) is formed by temporary oxidizing as shown in FIG. 20B.

At this time, an upper surface 50C of wafer 21 is in an amorphous state due to the impurity ion-implantation for $n^+$-type source region 4 and $p^+$-type body contact region 17 thereat. Accordingly, upper surface 50C is oxidized with oxidizing velocity faster than that at a bottom surface 50A of U-groove 50, and a film thickness c of oxide film 70 formed on upper surface 50C is thicker than a film thickness a of bottom surface 50A. In addition, a film thickness b (in a direction perpendicular to the main surface of wafer 21).of oxide film 70 at a sidewall portion 50B of U-groove 50 is made thicker than film thickness a of oxide film 70 at bottom surface 50A.

Figure 20C:
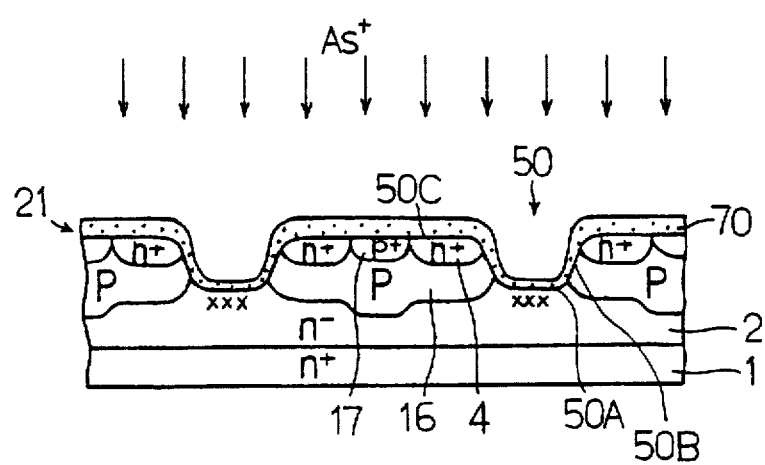

Then, as illustrated in FIG. 20C, n-type impurity is ion-implanted in a direction substantially perpendicular to the main surface of wafer 21. The energy of these ions is adjusted by selecting acceleration voltage, for example, so that a projected range (Rp) for oxide film 70 is greater than film thickness a but less than film thickness b and c. Subsequently, the projected impurities are implanted into the silicon surface at bottom surface 50A of U-groove 50 but not reach the silicon surface at sidewall surface 50B and upper surface 50C because the impurities stay in oxide film 70.

Next, thermal treatment is performed, thereby an n-type diffusion region 75 is formed at bottom surface 50A of U-groove 50.

Figure 17:
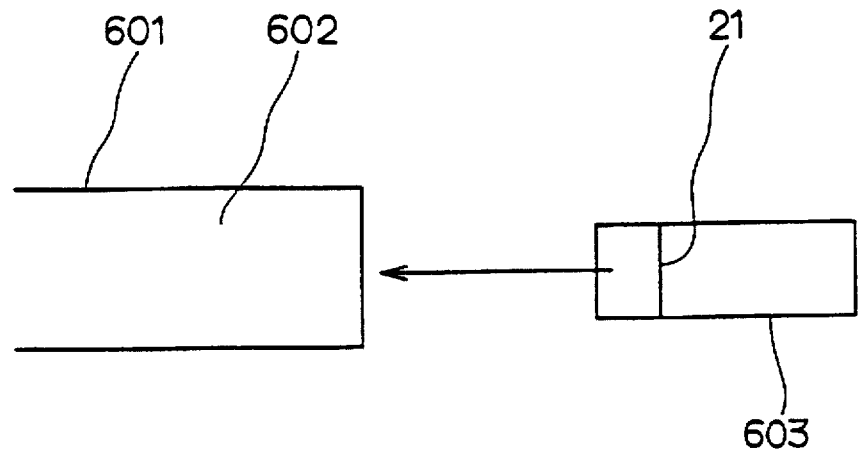
FIG. 17 is a view illustrating the manufacturing process of the vertical type power MOSFET of the basic structure.
Figure 18:
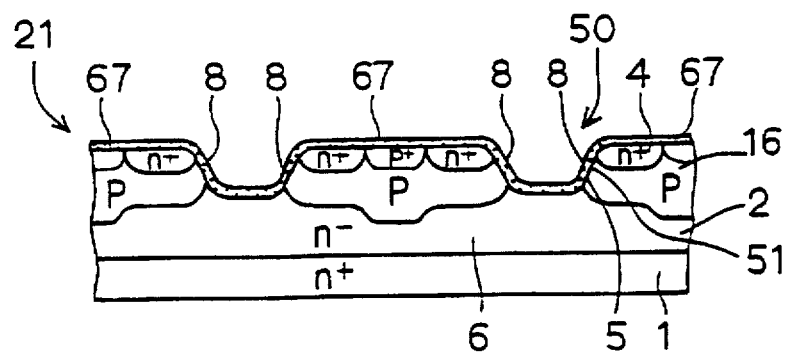
FIG. 18 is a cross-sectional view illustrating the manufacturing process of the important part of the vertical type power MOSFET of the basic structure.
Figure 19:
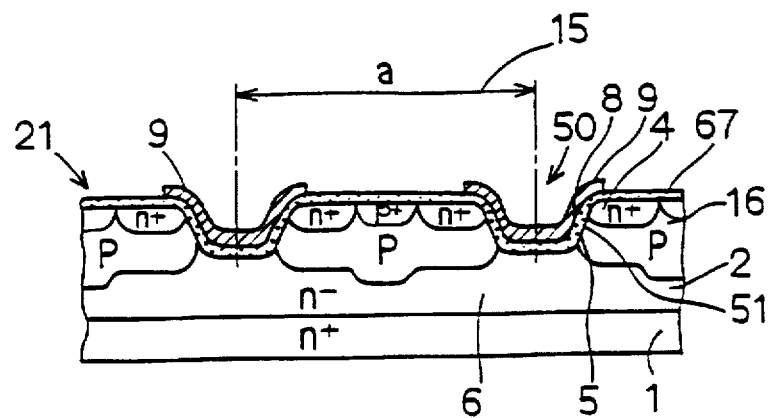
FIG. 19 is a cross-sectional view illustrating the manufacturing process of the important part of the vertical type power MOSFET of the basic structure.
Figure 20D:
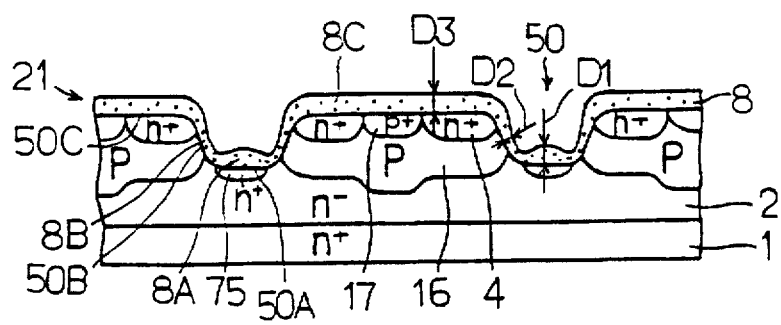

After removing temporary oxide film 70 (as same as FIG. 16), the thermal treatment is performed in the same manner as in FIGS. 17 and 18 to form gate oxide film 8 (FIG. 20D). The oxidizing velocity of bottom surface 50A of U-groove 50 becomes faster than those of sidewall surface 50B and upper surface 50C since bottom surface 50A is in an amorphous state due to the ion implantation performed in the previous step of FIG. 20C. As a result, gate oxide film 8 on bottom surface 50A of U-groove 50 can be selectively thickened.

Figure 21:
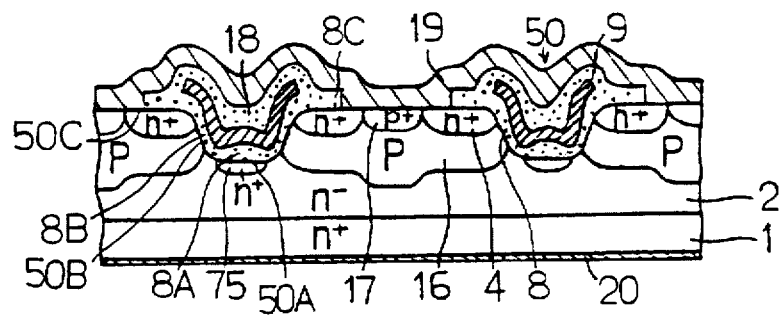
FIG. 21 is a cross-sectional view illustrating the important part of the resultant vertical type power MOSFET according to the first embodiment of the present invention.

The rest of this manufacturing method is the same as another part of the above-mentioned basic manufacturing method (FIG. 19 and FIG. 1B), and a concave type power MOSFET illustrated in FIG. 21 is ultimately structured. As illustrated in FIG. 21, gate oxide film 8 formed on a region including sidewall 50B and bottom 50A of U-groove 50 includes upper portion 8C ranged from the main surface to the inlet of the groove, sidewall portion 8B from the inlet of the groove to the bottom and bottom portion 8A on the bottom of the groove. Film thickness D1 of bottom portion 8A is thicker than film thickness D2 (in a direction perpendicular to sidewall surface 50B) of sidewall portion 8B. Further, according to the first embodiment, at the bottom portion 50A of U-groove 50, n-type diffusion region 75 is formed.

In this structure, since film thickness D1 of gate oxide film 8 on portion 8A between gate electrode 9 and semiconductor substrate 2 is thickened, the capacitance of oxide film thereat is reduced. Accordingly, the input and output capacitance of gate oxide film 8 can be reduced, and a switching loss can be also reduced because switching time can be shortened. Furthermore, as the film thickness of gate oxide film 8A at bottom 50A of groove 50 is thickened, greater dielectric breakdown strength is obtained.

In addition, due to the existence of n-type diffusion region 75, the impurity concentration of the semiconductor substrate (n⁻-type epitaxial layer) 2 below bottom portion 50A of U-groove 50 becomes high, thereby causing a resistance component associated with an accumulation region below U-groove 50 to be reduced. Accordingly, ON-resistance of the device can be lowered.

In the present embodiment, as bottom positioned gate oxide film 8A can be selectively thickened by the ion implantation and thermal oxidation techniques without using any photolithographic processes, the number of mask processes can be prevented from increasing. Further, since ions for forming n-type diffusion region 75 are self-alignedly implanted into the bottom of groove 50, no displacement in implanting ions occurs, and n-type diffusion region 75 formed is correctly disposed beneath the bottom of groove 50.

Furthermore, as shown in FIG. 21, bottom positioned gate oxide film 8A has a thickness distribution so that the thickness thereof becomes thicker as closer to the central portion of U-groove 50. Therefore, gate electrode 9 disposed thereon can be provided deeply for sidewall surface 50B of groove 50 without deepening the groove, thereby firmly and uniformly defining channel 5 in body region 16.

In the present embodiment, temporary oxide film 70 is formed in advance, then gate oxide film 8 is formed after implanting ions and removing temporary oxide film 70, but in case gate oxide film 8 is formed without removing oxide film 70, the film thickness of gate oxide film 8 can be controlled as same as the above-mentioned present embodiment.

Figure 22A:
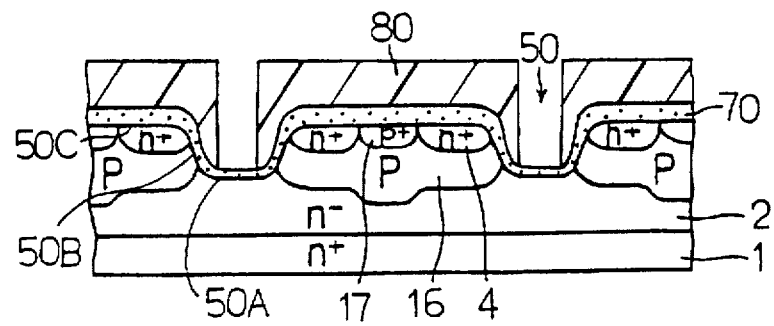
FIGS. 22A through 22C are cross-sectional views illustrating a manufacturing process of an important part of a vertical type power MOSFET according to a second embodiment of the present invention.

A manufacturing process of a second embodiment will now be explained with reference to FIGS. 22A through 22C. Subsequent to the step of FIG. 13, temporary oxide film 70 is formed by temporarily oxidizing the surface of wafer 21 like in the first embodiment. Then, photoresist film 80 is coated and patterned by means of photolithographic process to expose the upper surface of bottom 50A of U-groove 50 as shown in FIG. 22A. The area of removing photoresist film is set at a center part of bottom 50A of U-groove 50 so that the impurities to be ion-implanted are apart from source region 4.

Figure 22B:
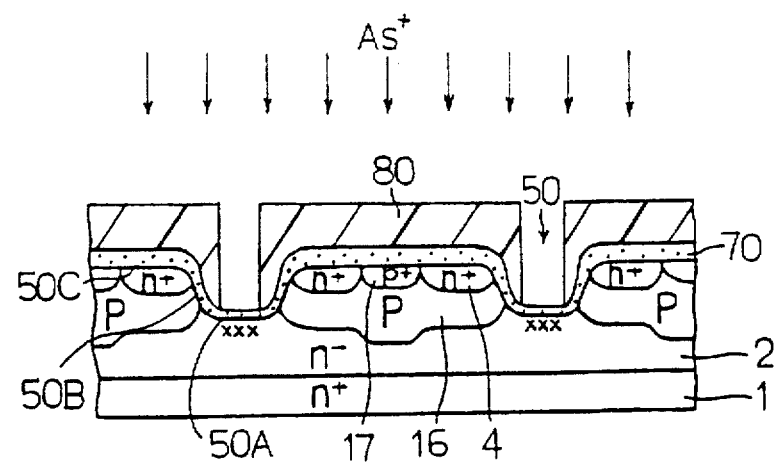
Figure 22C:
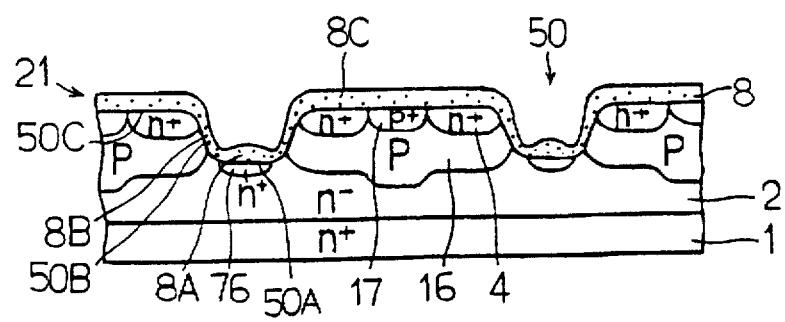

Then, arsenic (As), which is an n-type impurity, is ion-implanted as shown in FIG. 22B, thermal diffusion is applied after stripping off photoresist film 80. Like in the first embodiment, after removing temporary oxide film 70 and subsequent gate oxidizing, gate oxide film 8 is formed as illustrated in FIG. 22C. As a result of these processes, since the surface at the bottom 50A Of groove 50 is in an amorphous state due to the ion implantation of FIG. 22B, the oxidizing velocity at the bottom 50A is faster than the velocity at sidewall 50B and upper surface 50C. Therefore, gate oxide film 8A on bottom 50A of groove 50 can be selectively thickened. In addition, n-type diffusion region 76 is formed at the bottom surface of U-groove 50.

The rest of manufacturing method of the second embodiment is continued from FIG. 19 described in the above-mentioned basic manufacturing method.

The same effect as in the first embodiment can be obtained. Further, besides the reduction effect in the accumulation resistance, n-type diffusion region 76 can surely be disposed to be apart from p-type body region 16, no high-concentrated pn junction is thereby created between drain and source of the device, and thus, high drain-to-source withstand voltage can be maintained. Also, during the ion implantation, the sidewall 50B of U-groove is prevented from being bombarded with ions, and so gate oxide film 8 formed on channel 5 does not become thickened. Therefore, good controllability of the threshold voltage is obtained.

In the present embodiment, the gate oxidation is performed after removing temporary oxide film 70 sequent to the ion implantation of FIG. 22B, the same configuration can be obtained when gate oxidation is performed after the ion implantation without removing oxide film 70.

A manufacturing method of a third embodiment will be described. The manufacturing method of the third embodiment is almost the same as the manufacturing method of the second embodiment except that the impurity which does not form n-type nor p-type, such as N, Si and O, is ion-implanted instead of ion-implanting As of n-type impurity.

Figure 23A:
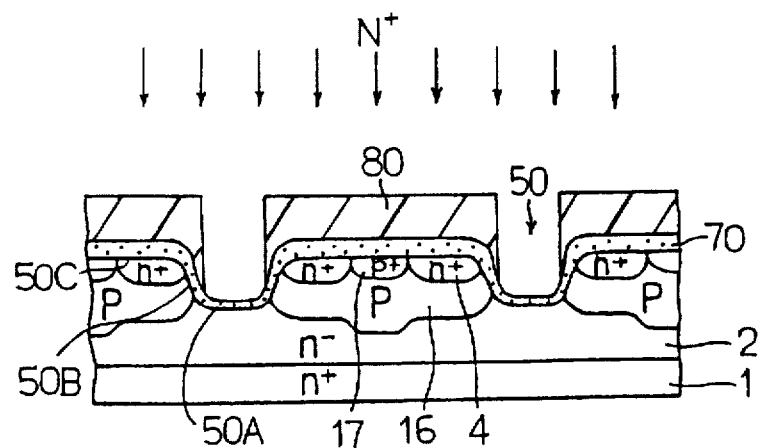
FIGS. 23A and 23B are cross-sectional views illustrating a manufacturing process of an important part of a vertical type power MOSFET according to a third embodiment of the present invention.

After temporarily oxidizing the surface of wafer 21 to form temporary oxide film 70, photoresist film 80 is coated. As shown in FIG. 23A, the photoresist film on bottom 50A of U-groove 50 is removed by means of photolithographic process. The whole photoresist film on bottom 50A of U-groove can be removed.

Figure 23B:
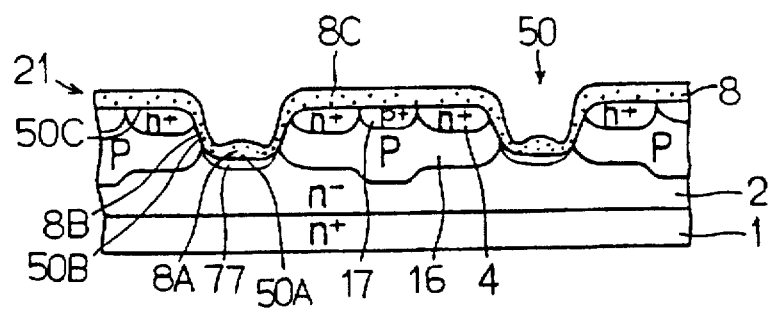

Then, impurities which do not form n-type nor p-type region, such as N, Si and O are ion implanted. As a result of the implantation, the surface of bottom surface 50A of groove 50 is caused to be in an amorphous state due to the ion implantation. Then, after stripping off photoresist film 80, gate oxidation is performed to form gate oxide film. As described above, since the surface of bottom surface 50A of groove 50 is in the amorphous state, the oxidizing thereat progresses rapidly, whereby gate oxide film 8A at bottom 50A of U-groove 50 can be selectively thickened. At this time, at bottom surface 50A of U-groove 50 is formed impurity diffusion region 77 as illustrated in FIG. 23B.

The rest of the third embodied manufacturing method continues from the manufacturing stage illustrated in FIG.

Figure 24:
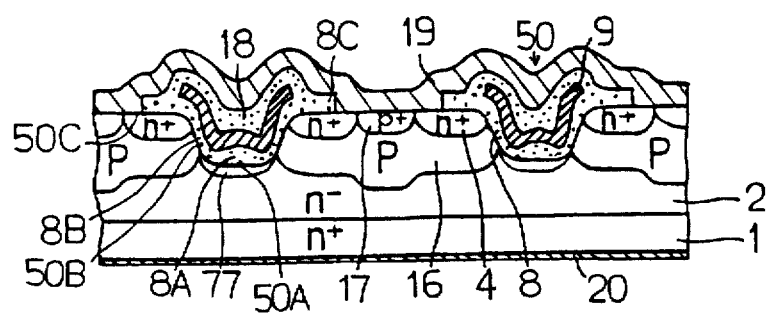
FIG. 24 is a cross-sectional view illustrating the important part of the resultant vertical type power MOSFET according to the third embodiment of the present invention.

19 of the above-mentioned basic manufacturing method, and finally a structure shown in FIG. 24 is obtained.

In this embodiment, the impurity diffusion region 77 at the groove bottom is not p-type nor n-type region, so no pn junction of high concentration is formed between drain and source even if impurity diffusion region 77 is made contact with p-type body region 16. Consequently, high breakdown voltage is secured because no reduction in breakdown strength is occurred between drain and source.

Next, a manufacturing method of a fourth embodiment will be described. This manufacturing method is a sequel to the process illustrated in FIG. 13 in the above-mentioned basic manufacturing method.

Figure 25A:
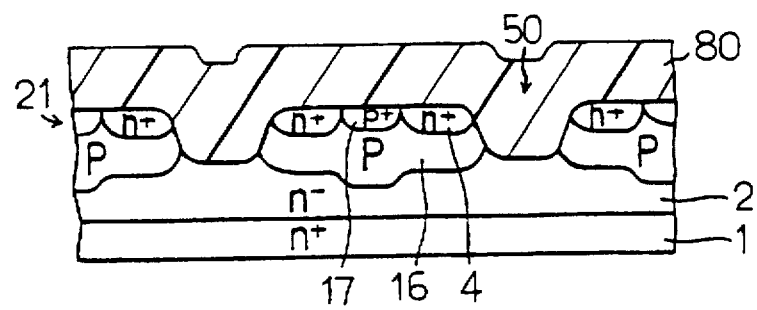
FIGS. 25A through 25D are cross-sectional views illustrating a manufacturing process of an important part of a vertical type power MOSFET according to a fourth embodiment of the present invention.
Figure 25B:
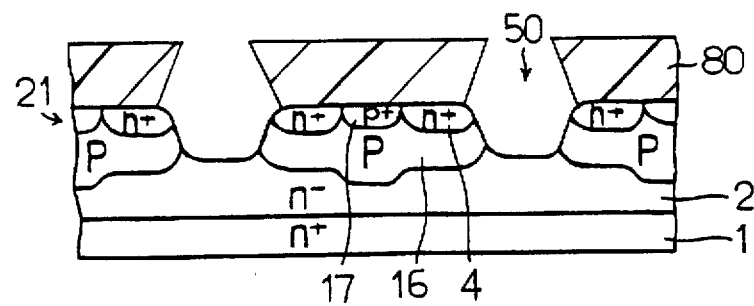
Figure 25C:
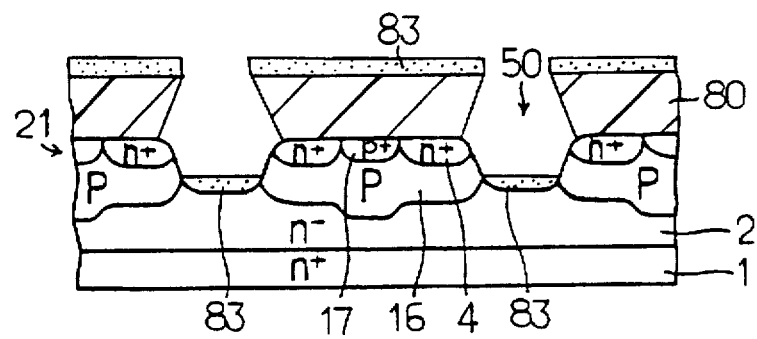
Figure 25D:
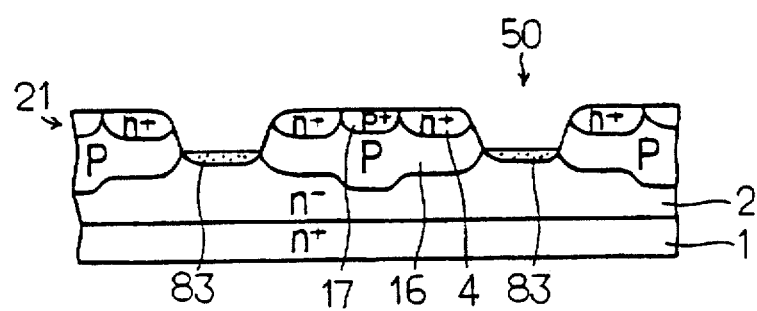
Figure 28:
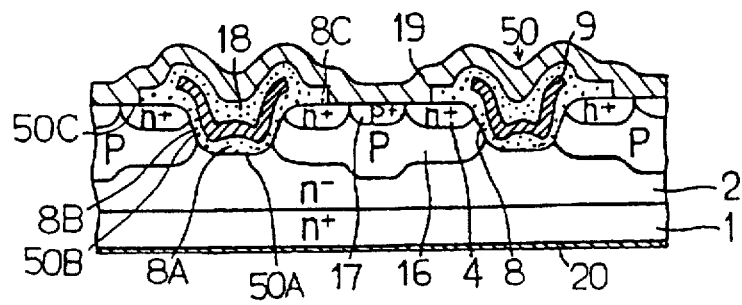
FIG. 28 is a cross-sectional view illustrating the important part of the resultant vertical type power MOSFET according to any one of fourth through sixth embodiments of the present invention.

As shown in FIG. 25A, photoresist film 80 is coated over the surface of wafer 21. Then, photoresist film 80 is processed, using photolithographic process, to have an opening which exposes the groove bottom in such a manner that a cross-section thereof is in a bottom-spreading tapered configuration as shown in FIG. 25B. Next, as illustrated in FIG. 25C, oxide film 83 is deposited by an anisotropical deposition method such as CVD or the like. Accordingly, a thick oxide film 83 is positioned at the bottom of groove 50 by removing photoresist film 80 (so-called lift-off method) as shown in FIG. 25D, and a gate oxidation is then performed to complete gate oxide film 8. The rest of this manufacturing method is same as the process from FIG. 19 described in the basic manufacturing method and finally obtains a structure shown in FIG. 28.

A manufacturing method of a fifth embodiment will now be described. This manufacturing method is a sequel to the process of FIG. 13 described in the basic manufacturing method.

Figure 26A:
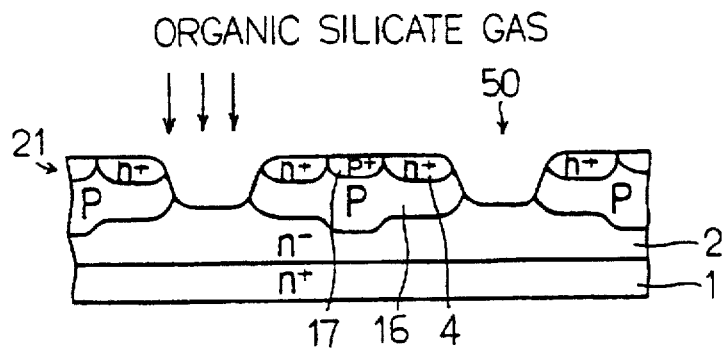
FIGS. 26A through 26C are cross-sectional views illustrating a manufacturing process of an important part of a vertical type power MOSFET according to a fifth embodiment of the present invention.
Figure 26B:
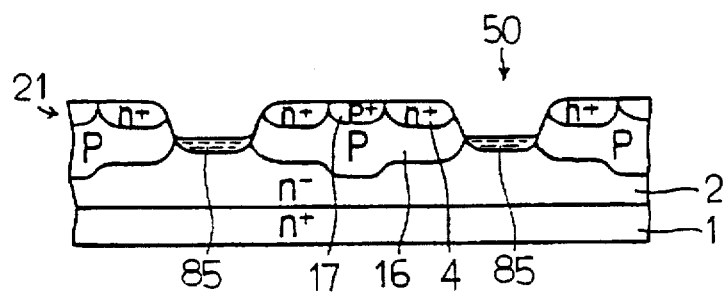
Figure 26C:
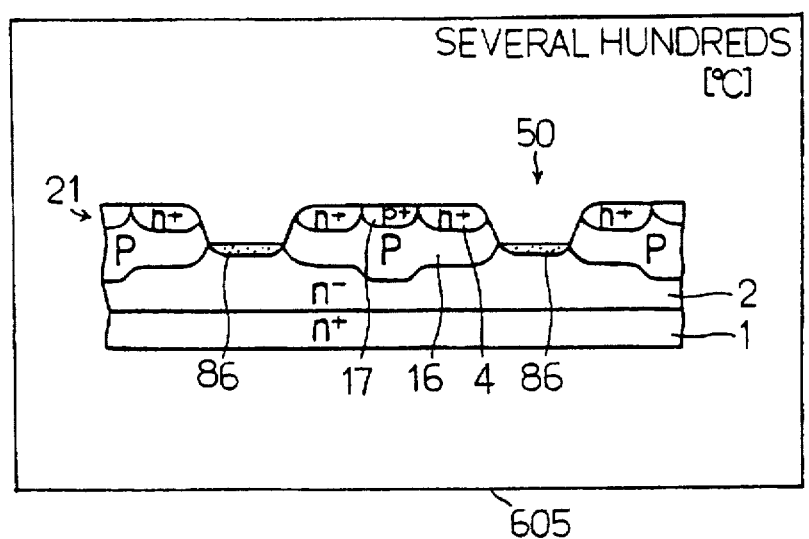

After removing LOCOS oxide film 65 formed on the surface (FIG. 13), the wafer is cooled down using liquid nitrogen in an organic silicate gas atmosphere as illustrated in FIG. 26A. Accordingly, as shown in FIG. 26B, organic silicate 85 is liquified at the wafer surface and accumulated on the bottom of groove 50. Then, heat-treatment is performed on the wafer in a furnace 605 at several hundreds of degree as shown in FIG. 26C, whereby a thick oxide film 86 is selectively disposed on the groove bottom.

Next, a gate oxidation is performed as in the fourth embodiment. The rest of this manufacturing method is identical to the process illustrated in FIG. 19 of the above-described basic manufacturing method and finally obtains a structure illustrated in FIG. 28.

A manufacturing method of a sixth embodiment will now be described. This manufacturing method is also a sequel to the process illustrated in FIG. 13 of the above-mentioned basic manufacturing method.

Figure 27A:
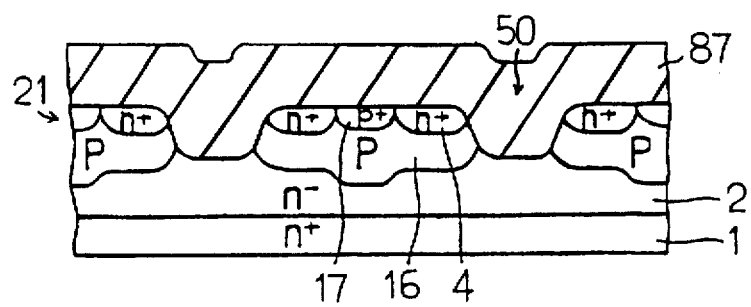
FIGS. 27A through 27C are cross-sectional views illustrating a manufacturing process of an important part of a vertical type power MOSFET according to a sixth embodiment of the present invention.
Figure 27B:
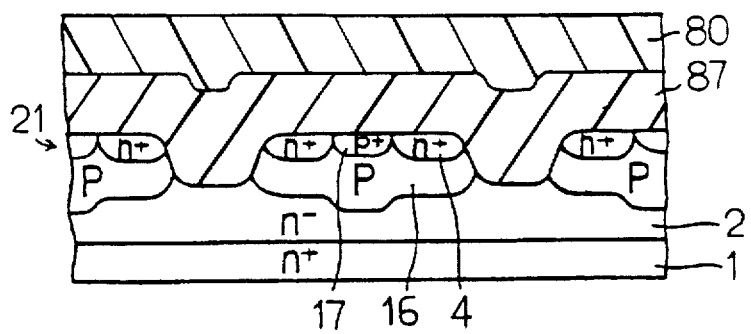
Figure 27C:
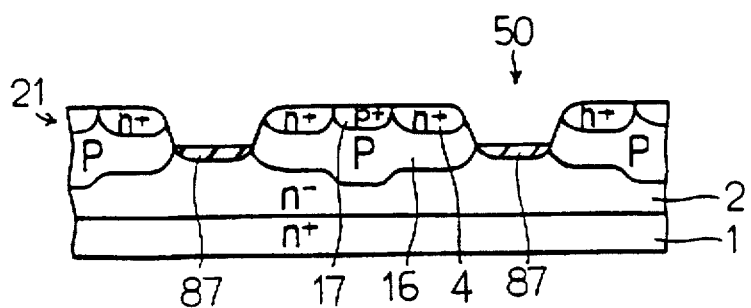

After removing the LOCOS oxide film formed on the surface of wafer 21 (FIG. 13), oxide film 87 is deposited by means of an anisotropical deposition method such as CVD or the like as illustrated in FIG. 27A. Next, photoresist film 80 is coated thereon as shown in FIG. 27B so that photoresist film 80 becomes thick at a portion above the groove bottom due to the unevenness of the surface. Consequently, since the photoresist film on the groove bottom is thick, oxide film 87 can be remained On groove bottom 50 as shown in FIG. 27C by performing an anisotropically etching back of the photoresist film and the CVD film.

Next, a gate oxidation is performed as in the fourth embodiment to complete gate oxide film 8. The rest of this manufacturing method is identical to the process illustrated in FIG. 19 of the above-described basic manufacturing method and finally obtains a structure illustrated in FIG. 28.

According to the fourth through sixth embodiments, since on the bottom of U-groove is deposited an oxide film prior to the gate oxidation, the gate oxide film can be readily and selectively thickened at the bottom of U-groove by using the previously deposited oxide film as a part of the bottom positioned gate oxide film.

A manufacturing method of a seventh embodiment will now be described with reference to FIGS. 20A and 20B.

This manufacturing method is a sequel to the process illustrated in FIG. 13 of the above-mentioned basic manufacturing method. After removing the local oxide film formed on the surface as shown in FIG. 20A, deposition or thermal oxidation is performed to form a temporary oxide film 70 as shown in FIG. 20B. A difference in oxide film thickness may be seen in FIG. 20B, but the difference is not necessary to be in the thickness in this embodiment. Then, after a photoresist film is coated to cover only the groove bottom where a thickened gate oxide film is to be disposed, the exposed oxide film which is not covered with the photoresist film is etched to be thin. Then, gate oxidation is performed. The rest of this manufacturing method is identical to the process illustrated in FIG. 19 described in the basic manufacturing method.

Next, a manufacturing method of a eighth embodiment will be described with reference to FIGS. 20A and 20B. This manufacturing method is a sequel to the process illustrated in FIG. 13 of the above-described basic manufacturing method. After removing the local oxide film formed on the surface as shown in FIG. 20A, depositing or thermal oxidation is performed to form an oxide film 70 as illustrated in FIG. 20B. A difference in oxide film thickness may be seen in FIG. 20B, but the difference is not necessary to be in the thickness in this embodiment. Next, an oxidation-resistant masking material, such as silicon nitride, is formed on the wafer surface. The oxidation-resistant masking material is then patterned by means of photolithographic process to expose only the groove bottom where a thickened gate oxide film is to be disposed. The exposed area is selectively oxidized using the patterned oxidation-resistant masking material as an oxidation mask. Then, the oxidation-resistant masking material is removed by etching, and gate oxidation is performed to obtain a gate oxide film. The rest of this manufacturing method is identical to the process from the process illustrated in FIG. 19 of the above-mentioned basic manufacturing method.

As described above, according to the embodiments of the present invention, since the film thickness of the gate oxide film positioned on the bottom of the concave structure (U-groove) is selectively thickened, the capacitance of oxide film between the gate electrode and the semiconductor substrate under the concave structure is reduced. Accordingly, the input and output capacitance of the gate oxide film can be reduced, and a switching loss can be also reduced because switching time can be shortened. Furthermore, as the film thickness of the gate oxide film at the bottom of the concave structure is thickened, greater dielectric breakdown strength is obtained.

Figure 29:
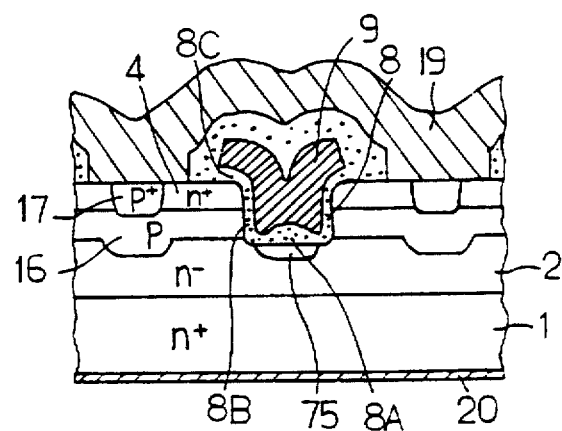
FIG. 29 is a cross-sectional view illustrating an important part of a vertical type power MOSFET according to an applied embodiment of the present invention.

The above-mentioned embodiments are described limiting the manufacturing method of a semiconductor device having a U-shaped, or bathtub-shaped concavity formed after removing the local oxide film. However, the method of making the film at the groove bottom thick described in the above embodiments does not limit the shape of the concavity. The present invention is applicable to a semiconductor device having a groove with a gate electrode buried therein, such as trench-type power MOSFET illustrated in FIG. 29 and trench-type IGBT, and also applicable to power IC integrating such concave type power device.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device comprising:

a semiconductor substrate having a first conductivity type semiconductor region at a main surface thereof, said semiconductor substrate having within said semiconductor region a concave portion which has a bottom surface and a sidewall surface;

a body region of a second conductivity type formed within said semiconductor region and in contact with said sidewall surface of said concave portion;

a source region of said first conductivity type formed within said body region, wherein a channel region is defined at said sidewall surface of said concave portion by a portion of said body region between said source region and said semiconductor region;

a gate insulating film disposed to cover said sidewall surface and said bottom surface of said concave portion;

a gate electrode disposed on said concave portion to be insulated with said gate insulating film; and an impurity diffusion region disposed at said bottom surface of said concave portion;

wherein said gate insulating film covering said bottom surface of said concave portion has a distribution in thickness thereof such that a thickness becomes thicker closer to a central portion of said bottom surface of said concave portion, and a thickness of said gate insulating film at said central portion of said bottom surface of said concave portion is controlled to be thicker than a thickness of said gate insulating film at said sidewall surface of said concave portion.

2. A semiconductor device according to claim 1, wherein:

a depth of said concave portion is selected to be shallower than a junction depth of said body region.

3. A semiconductor device according to claim 1, wherein:

said semiconductor substrate is silicon; and said main surface of said semiconductor substrate is oriented in a (100) plane.

4. A semiconductor device according to claim 3, wherein:

an elevation angle of said sidewall surface with respect to said main surface of said semiconductor substrate is selected such that said sidewall surface is substantially oriented in a (111) plane.

5. A semiconductor device according to claim 1, wherein:

said gate insulating film is further disposed on said main surface of said semiconductor substrate covering an inlet portion of said concave portion.

6. A semiconductor device according to claim 5, wherein:

said gate insulating film disposed on said main surface of said semiconductor substrate has a thickness thicker than said gate insulating film at a portion of said sidewall surface where said channel region is disposed.

7. A semiconductor device according to claim 1, wherein:

said impurity diffusion region has said first conductive type and an impurity concentration higher than an impurity concentration of said semiconductor region.

8. A semiconductor device according to claim 7, wherein:

said impurity diffusion region is disposed to be apart from said body region.

9. A semiconductor device according to claim 1, wherein:

said impurity diffusion region is a region which is implanted with an impurity of neither n-type dopant nor p-type dopant.

10. A semiconductor device according to claim 9, wherein said impurity implanted into said region is any one of:

N-ion;

Si-ion; and

O-ion.

11. A semiconductor device comprising:

a semiconductor substrate having an n-type semiconductor region at a main surface thereof, said semiconductor substrate having within said semiconductor region a concave portion which has a bottom surface and a sidewall surface;

a body region of a p-type formed within said semiconductor region and in contact with said sidewall surface of said concave portion;

a source region of said n-type formed within said body region, wherein a channel region is defined at said sidewall surface of said concave portion by a portion of said body region between said source region and said semiconductor region;

a gate insulating film disposed to cover said sidewall surface and said bottom surface of said concave portion;

a gate electrode disposed on said concave portion insulated with said gate insulating film; and an impurity diffusion region disposed at said bottom surface of said concave portion;

said gate insulating film covering said bottom surface of said concave portion having a distribution in thickness thereof such that a thickness becomes thicker closer to a central portion of said bottom surface of said concave portion, and a thickness of said gate insulating film at said central portion of said bottom surface of said concave portion is controlled to be thicker than a thickness of said gate insulating film at said sidewall surface of said concave portion.

12. A semiconductor device according to claim 11, wherein:

said depth of said concave portion is shallower than a junction depth of said body region.

13. A semiconductor device according to claim 12, wherein:

said impurity diffusion region is a region implanted with an impurity of As-ion.

14. A semiconductor device according to claim 11, wherein:

said semiconductor substrate is silicon; and said main surface of said semiconductor substrate is oriented in a (100) plane.

15. A semiconductor device according to claim 14, wherein:

an elevation angle of said sidewall surface with respect to said main surface of said semiconductor substrate is selected such that said sidewall surface is substantially oriented in a (111) plane.

16. A semiconductor device according to claim 11, wherein:

said gate insulating film is further disposed on said main surface of said semiconductor substrate covering an inlet portion of said concave portion.

17. A semiconductor device according to claim 16, wherein:

said gate insulating film disposed on said main surface of said semiconductor layer has a thickness thicker than said gate insulating film at said sidewall portion where said channel region is disposed.

18. A semiconductor device according to claim 11, wherein:

said impurity diffusion region has said n-type and an impurity concentration higher than an impurity concentration of said semiconductor region.

19. A semiconductor device according to claim 18, wherein:

said impurity diffusion region is disposed to be apart from said body region.

20. A semiconductor device comprising:

a semiconductor substrate having a first conductivity type semiconductor region at a main surface thereof oriented in a (100) plane, said semiconductor substrate having within said semiconductor region a concave portion which has a bottom surface and a sidewall surface;

a body region of a second conductivity type formed up to a depth deeper than a depth of said concave portion within said semiconductor region and in contact with said sidewall surface of said concave portion;

a source region of said first conductivity type formed within said body region, wherein a channel region is defined at said sidewall of said concave portion by a portion of said body region between said source region and said semiconductor region;

a gate insulating film disposed to cover an inlet portion, said sidewall surface and said bottom surface of said concave portion; and a gate electrode disposed on said concave portion insulated with said gate insulating film;

a thickness of said gate insulating film between said gate electrode and said sidewall surface of said concave portion being thinner than a thickness of said gate insulating film between said gate electrode and said inlet portion of said concave portion;

said gate insulating film covering said bottom surface of said concave portion having a distribution in thickness thereof such that a thickness becomes thicker closer to a central portion of said bottom surface of said concave portion; and an impurity diffusion region disposed at said bottom surface of said concave portion.

21. A semiconductor device according to claim 20, wherein:

said semiconductor substrate is silicon; and said main surface of said semiconductor substrate is oriented in a (100) plane.

22. A semiconductor device according to claim 21, wherein:

an elevation angle of said sidewall surface with respect to said main surface of said semiconductor substrate is selected such that said sidewall surface is substantially oriented in a (111) plane.

23. A semiconductor device according to claim 20, wherein:

said impurity diffusion region has said first conductive type and an impurity concentration higher than an impurity concentration of said semiconductor region.

24. A semiconductor device according to claim 23, wherein:

said impurity diffusion region is disposed to be apart from said body region.

25. A semiconductor device according to claim 20, wherein:

said impurity diffusion region is a region implanted with an impurity of neither n-type dopant nor p-type dopant.

* * * * *